United States Patent [19]
Nevill et al.

[11] Patent Number: 5,982,682
[45] Date of Patent: Nov. 9, 1999

[54] SELF-TEST CIRCUIT FOR MEMORY INTEGRATED CIRCUITS

[75] Inventors: Leland R. Nevill; Ray Beffa, both of Boise; Warren M. Farnworth, Nampa; Gene Cloud, Boise, all of Id.

[73] Assignee: Micron Technology, Inc., Boise, Id.

[21] Appl. No.: 09/041,859

[22] Filed: Mar. 12, 1998

Related U.S. Application Data

[63] Continuation of application No. 08/808,391, Feb. 28, 1997, Pat. No. 5,754,486.

[51] Int. Cl.$^6$ .................................................. G11C 29/00
[52] U.S. Cl. .......................... 365/201; 365/190; 365/202; 365/149; 365/189.07; 371/21.2; 371/21.3
[58] Field of Search ..................................... 365/201, 190, 365/202, 149, 189.07; 371/21.2, 21.3

[56] References Cited

U.S. PATENT DOCUMENTS

| | | | |
|---|---|---|---|
| 5,140,553 | 8/1992 | Choi et al. | 365/201 |
| 5,285,419 | 2/1994 | Iyengar | 365/201 |
| 5,381,368 | 1/1995 | Morgan et al. | 365/189.01 |
| 5,440,517 | 8/1995 | Morgan et al. | 365/202 |
| 5,555,212 | 9/1996 | Toshiaki et al. | 365/200 |
| 5,684,809 | 11/1997 | Stave et al. | 371/27 |

*Primary Examiner*—Andrew Q. Tran
*Attorney, Agent, or Firm*—Seed and Berry LLP

[57] ABSTRACT

A sense amplifier senses and stores data from a memory cell in an array of memory cells arranged in rows and columns. The sense amplifier includes a sense circuit having a pair of first and second complementary digit lines which senses a voltage differential between the first and second complementary digit lines and in response to the sensed voltage differential drives the first and second complementary digit lines to voltage levels corresponding to complementary logic states. An isolation circuit is coupled between the pair of first and second complementary digit lines of the sense amplifier and a pair of first and second complementary digit lines associated with a column of memory cells. The isolation circuit is operable to couple the first complementary digit line of the sense amplifier to the first complementary digit line of the column of memory cells and the second complementary digit line of the sense amplifier to the secondary complementary digit line of the column of memory cells. A switch circuit is operable to couple the first complementary digit line of the sense amplifier to the second complementary digit line of the column of memory cells, and the second complementary digit line of the sense amplifier to the first complementary digit line of the column of memory cells. An equilibration circuit is coupled between the pair of complementary digit lines of the column of memory cells and is operable to equalize the voltage level on the digit lines to a predetermined level.

31 Claims, 7 Drawing Sheets

SELF-TEST CIRCUIT FOR MEMORY INTEGRATED CIRCUITS

CROSS REFERENCE TO RELATED APPLICATION

This application is a continuation of U.S. patent application Ser. No. 08/808,391, filed Feb. 28, 1997, now U.S. Pat. No. 5,754,486.

TECHNICAL FIELD

The present invention relates generally to the testing of memory integrated circuits, and, more specifically, to a method and apparatus for reducing the test time of memory cells in any type of dynamic random access memory ("DRAM").

BACKGROUND OF THE INVENTION

During the manufacture of dynamic random access memories ("DRAMs"), it is useful to test the DRAM to assure that it is operating properly. Electronic systems containing DRAMs, such as computers, normally test the DRAMs when power is initially applied to the system. A DRAM is typically arranged as an array of individual memory cells. In order to assure that each memory cell is operating properly, prior art test methods write data having a first binary value (e.g., a 1) to all memory cells in the memory array. For a memory array having n rows and m columns of memory cells, it requires n×m bus cycles to write the first binary data values to all the memory cells in the memory array. A bus cycle is the period of time it takes to write or read data to or from an individual memory cell in the DRAM. After having written the first binary data values to the memory cells, this data must be read from the memory cells to assure that each memory cell is operating properly. Once again, this requires n×m bus cycles to read the data having a first binary value. Data having a second binary value (e.g., a 0) is next written to each memory cell in the memory array and is then read from each memory cell to assure each memory cell is operating properly. Each of these read and write operations also requires n×m bus cycles to complete. Therefore, to test each memory cell in the memory array, a total of four times n×m bus cycles is required. In the case of a 64 megabit DRAM organized in a×4 input output configuration, 67,108,864 bus cycles are required to perform a complete test of every memory cell.

As will be appreciated by one skilled in the art, the greater the number of bus cycles required to test all memory cells in a DRAM, the greater the time it takes to test the DRAM. Thus, it is desirable to reduce the number of bus cycles required to test all the memory cells of a DRAM.

SUMMARY OF THE INVENTION

A sense amplifier senses and stores data from a memory cell in an array of memory cells arranged in rows and columns. In one embodiment, the sense amplifier comprises a sense circuit having a pair of first and second complementary digit lines. The sense circuit senses a voltage differential between the first and second complementary digit lines, and in response to the sensed voltage differential, drives the first and second complementary digit lines to voltage levels corresponding to complementary logic states. An isolation circuit is coupled between the pair of first and second complementary digit lines of the sense circuit and a pair of first and second complementary digit lines associated with a column of memory cells. The isolation circuit operates to couple the first complementary digit line of the sense circuit to the first complementary digit line of the column of memory cells and the second complementary digit line of the sense circuit to the second complementary digit line of the column of memory cells. A switch circuit is coupled between the pair of first and second complementary digit lines of the sense circuit and the pair of first and second complementary digit lines of the column of memory cells. The switch circuit operates to couple the first complementary digit line of the sense circuit to the second complementary digit line of the column of memory cells and the second complementary digit line of the sense circuit to the first complementary digit line of the column of memory cells. An equilibration circuit is coupled between the pair of complementary digit lines of the column of memory cells to equalize the voltage level on the first and second digit lines of the column of memory cells to a predetermined level.

DETAILED DESCRIPTION OF THE INVENTION

Figure 1:
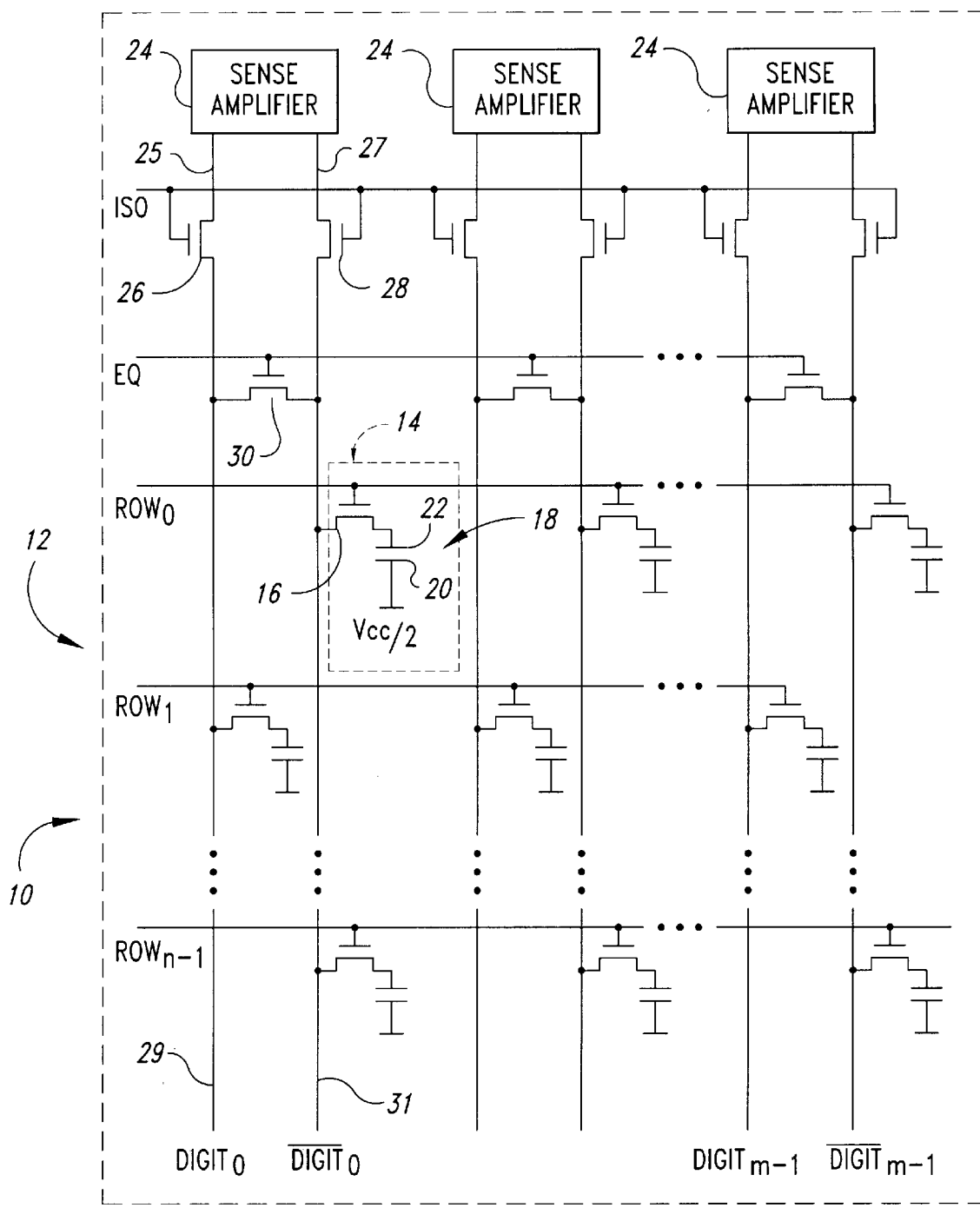
FIG. 1 is a schematic and block diagram of a memory-cell array of a conventional memory device.

FIG. 1 is a schematic and block diagram of a portion of a conventional DRAM 10 having a memory-cell array 12. The memory-cell array 12 includes a number of memory cells 14 arranged in rows and columns. Each memory cell 14 includes an access switch in the form of a transistor 16 and a storage element in the form of a capacitor 18. The capacitor 18 includes a first plate 20 coupled to a reference potential which is typically equal to approximately Vcc/2. The first plate 20 is generally common to the first plates 20 of all other capacitors 18 in the array 12. A second plate 22 of the capacitor 18 is coupled to the drain of the transistor 16. Each of the memory cells 14 stores a single bit of binary data. The binary data is stored in the memory cells 14 as a voltage across the capacitor 18. A voltage of approximately Vcc at the plate 22 of the capacitor 18 corresponds to a first binary data value. Conversely, a voltage of approximately zero volts at the plate 22 corresponds to a second binary data value.

The memory cells 14 are arranged in n rows and m columns. One memory cell 14 is positioned at the intersection of each row and column. Every row of memory cells 14 has an associated row line ROW and every column of memory cells has an associated digit line 29 and complementary digit line 31. Each memory cell 14 in a given row of memory cells has a control terminal in the form of the gate of the transistor 16 coupled to the associated row line ROW.

Each memory cell 14 in a given column of memory cells has a data terminal in the form of the source terminal of the transistor 16 coupled to one of the associated digit line 29 and complementary digit line 31.

Each pair of digit lines 29 and 31 is coupled to a sense amplifier 24 through a pair of isolation switches in the form of transistors 26 and 28. Specifically, the sense amplifier 24 has a first digit line 25 coupled to the digit line 29 of the array through the transistor 26, and a second complementary digit line 27 coupled to the complementary digit line 31 through the transistor 28. The gate of each of the isolation transistors 26 and 28 is coupled to an isolation line ISO which turns the transistors 26 and 28 ON to couple the complementary digit lines 25 and 27 of the sense amplifier to the digit lines 29 and 31, respectively, of the memory array 12. The sense amplifier 24 senses and stores data in an addressed memory cell 14 which is coupled to one of the digit lines 29 and 31. The memory-cell array 12 also includes equilibration switches in the form of transistors 30 coupled between each pair of digit lines 29 and 31. Each of the equilibration switches has a control terminal in the form of the gate of the transistor 30 coupled to an equilibrate line EQ.

In operation of the DRAM 10, before data is read from the memory cells 14, control circuitry (not shown in FIG. 1) executes an equilibration interval. During the equilibration interval, the control circuitry drives each of the row lines ROW with a voltage approximately equal to zero volts, thereby deactivating each of the memory cells 14. The isolation line ISO is also driven high, thereby turning ON the isolation transistors 26, 28 to couple the digit lines 25 and 27 of sense amplifier 24 to the digit lines 29 and 31, respectively, of the array. The equilibration line EQ is then driven high by the control circuitry to turn ON the transistor 30 and couple each pair of digit lines 29 and 31 together. By coupling the pairs of digit lines 29 and 31 together, the transistors 30 equalize the voltage on each digit line to approximately Vcc/2. Alternatively, the isolation transistors 26 and 28 can be turned OFF, and the digit lines 25, 27 can be equilibrated by circuitry in the sense amplifier 24 (not shown). Such equilibration of the sense amplifiers 24 is conventional and therefore not described in more detail.

After the equilibration interval, the control circuitry drives the row line ROW of the addressed memory cell 14 with a voltage approximately equal to Vcc to activate each memory cell coupled to the activated row line. The transistor 16 in each activated memory cell 14 is turned ON by Vcc applied to its gate, thereby transferring the voltage at the plate 22 of the capacitor 18 to the digit line 29 or 31 coupled to the activated memory cell. For example, if the row line $ROW_0$ is activated, the voltage on the plate 22 of the capacitor 18 in each memory cell 14 in the row is transferred to the complementary digit line 31 associated with that cell. The sense amplifiers 24 then compare the voltage on the digit line 29 or 31 coupled to the activated memory cell 14 to the voltage of Vcc/2 on the other digit line. In response to the sensed voltage differential between the digit lines 29 and 31, each sense amplifier 24 drives the higher digit line to approximately Vcc and drives the lower digit line to approximately zero volts. The voltage level on the digit lines 29 and 31 coupled to the activated memory cells 14 now represents the binary value of the data stored in the activated memory cells. The data contents of the addressed memory cell 14 is then read from the sense amplifier 24 coupled to the column of the addressed memory cell by read/write circuitry (not shown in FIG. 1).

A write operation is substantially different from a read operation because equilibration is not required in a write operation. Instead, complementary data is coupled through read/write data path circuitry (not shown) to respective write driver transistors (not shown) which apply the complementary data to the respective digit lines 29 and 31. During this time, one of the row lines ROW is driven high, thereby coupling the voltage on one of the digit lines 29 or 31 to the capacitor 22 in the memory cell 14 located at the intersection of the addressed row and column.

As seen from the description of a conventional read cycle, data from all memory cells 14 in a row which is activated is read into the sense amplifiers 24. If the read data in all the sense amplifiers 24 could be utilized, one skilled in the art will appreciate that the amount of time required to test each memory cell 14 in the memory-cell array 12 could be reduced. The preferred embodiment of the present invention reduces the test time of a DRAM by utilizing the read data stored in all the sense amplifiers 24 to simultaneously write a test pattern to the memory cells 14 in an activated row instead of writing to each cell individually as part of a memory test sequence.

Figure 2:
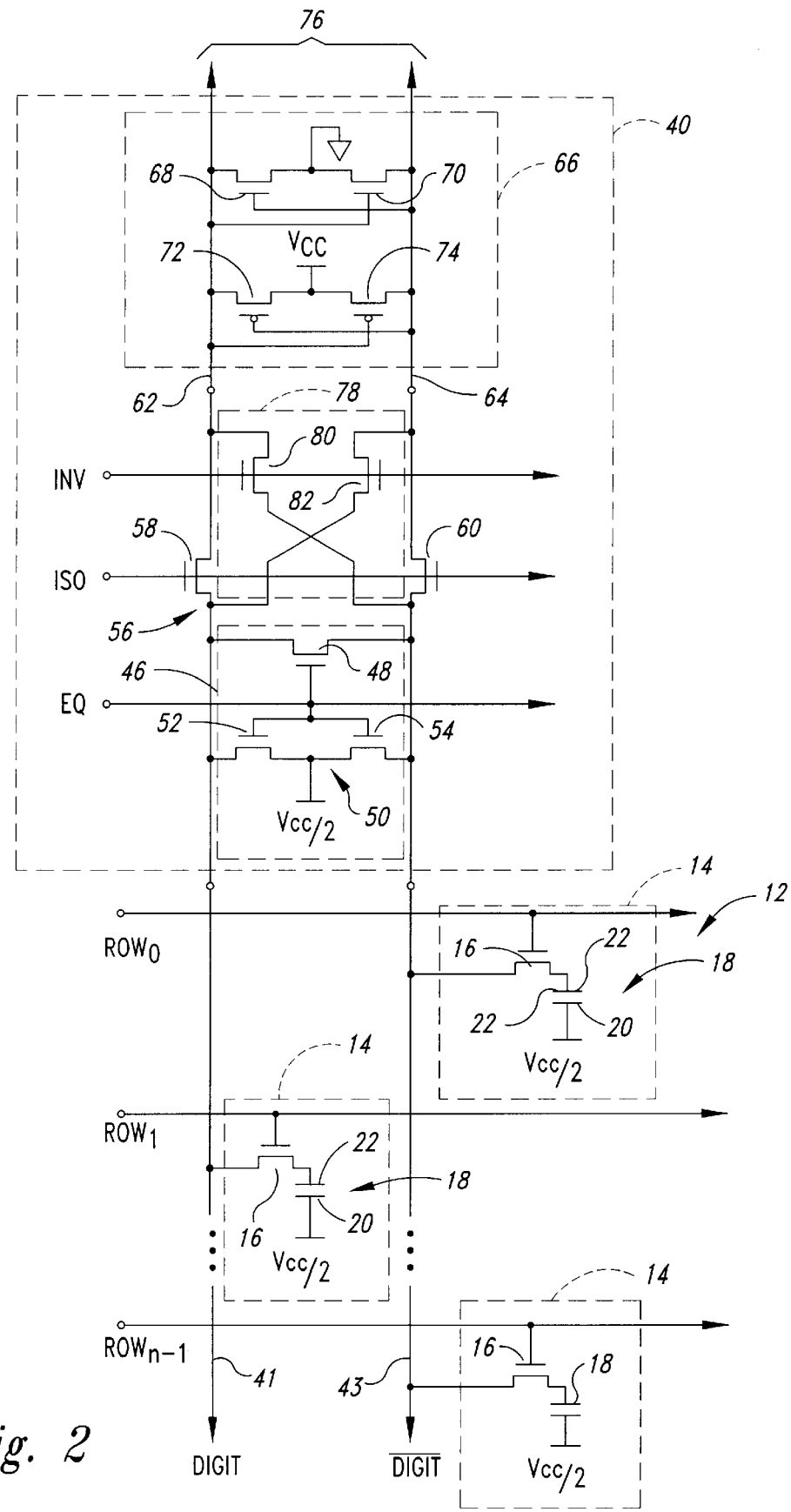
FIG. 2 is a schematic of a sense amplifier in accordance with the present invention.

FIG. 2 is a schematic diagram of a sense amplifier 40 in accordance with one embodiment of the present invention. The sense amplifier 40 is shown connected to one pair of complementary digit lines 41 and 43 contained in a conventional memory-cell array 12 as previously described with reference to FIG. 1. The sense amplifier 40 includes an equilibration circuit 46 coupled between the complementary digit lines 41 and 43 which operates to equalize the voltage on the complementary digit lines. The equilibration circuit 46 comprises an equilibration transistor 48 and a precharge circuit 50. The equilibration transistor 48 has its drain and source terminals coupled between the complementary digit lines 41 and 43 and its gate terminal coupled to an equilibration line EQ. The precharge circuit 50 includes a pair of transistors 52 and 54 with the drain terminals of these transistors connected to the complementary digit lines 41 and 43, respectively. The source terminals of the transistors 52 and 54 are connected to a reference voltage approximately equal to Vcc/2 and the gates of the transistors are coupled to the equilibration line EQ.

In operation, the equilibration circuit 46 equalizes the voltage on the complementary digit lines 41 and 43 to the same voltage of approximately Vcc/2. To activate the equilibration circuit 46, the equilibration line EQ is driven with a voltage approximately equal to Vcc. In response to this voltage on the equilibration line EQ, the transistors 48, 52 and 54 all are turned ON. The transistors 52 and 54 of the precharge circuit 50 operate to drive the complementary digit lines 41 and 43 to voltage levels approximately equal to Vcc/2, and the equilibration transistor 48 operates to assure that both the complementary digit lines are at the same voltage level. After the complementary digit lines 41 and 43 are equilibrated to approximately Vcc/2, the equilibration line EQ is driven to approximately zero volts to turn OFF the transistors 48, 52 and 54.

The sense amplifier 40 further includes an isolation circuit 56 coupled between a pair of complementary digit lines 62 and 64 of a sense circuit 66 and the complementary digit lines 41 and 43, respectively, of the memory-cell array 12. In the embodiment of FIG. 2, the isolation circuit 56 comprises a pair of isolation transistors 58 and 60. The gate terminals of the isolation transistors 58 and 60 are coupled to an isolation line ISO. In operation, the isolation circuit 56 couples the complementary digit lines 41 and 43 of the memory array 12 to the pair of complementary digit lines 62 and 64, respectively, of the sense circuit 66 when the isolation line ISO is driven with a voltage approximately equal to Vcc and the isolation transistors 58 and 60 turn ON.

The sense circuit 66 is part of the sense amplifier 40. In the embodiment of FIG. 2, the sense circuit 66 includes four transistors 68, 70, 72 and 74 connected as shown. The transistors 68 and 70 operate to couple a voltage of approximately zero volts to the digit lines 62 and 64, respectively. Operation of the transistors 68 and 70 is complementary such that when transistor 68 is ON, transistor 70 is OFF, and vice versa. The transistors 72 and 74 operate in the same complementary way to couple a voltage of Vcc to the digit lines 62 and 64, respectively. It should be noted that while the transistors 68 and 70 are shown as being connected directly to ground and transistors 72 and 74 as being connected directly to Vcc, such direct connections are merely for ease of explanation. Typically, a control circuit (not shown) couples the transistors to their respective voltage only when the sense amplifier 40 is to store data from an accessed memory cell 14 and otherwise decouples the transistors from their respective voltages.

The sense circuit 66 operates to sense a voltage differential between the complementary digit lines 62 and 64 and, in response to this sensed voltage differential, to drive the complementary digit lines 62 and 64 to voltage levels which correspond to complementary logic states. In other words, the sense circuit senses a voltage differential between the complementary digit lines 62 and 64 and drives the complementary digit line having the higher voltage to Vcc and the other complementary digit line to approximately zero volts.

Operation of the sense circuit 66 is best understood by way of example. Assume that an equilibration interval has just occurred so that the voltage level on the complementary digit lines 41 and 43 is equal to approximately Vcc/2. Further assume that the memory cell 14 coupled to the row line $ROW_0$ contains data corresponding to a binary 1, which typically means that the voltage at plate 22 of the capacitor 18 is approximately equal to zero volts, i.e., the complement of Vcc representing a logic 1. It should be noted that for the memory cells 14 which provide their data on the digit line 41, a binary 1 is stored as Vcc on the plate 22 of the capacitor 18 and a binary 0 as zero volts on the plate 22. When the row line $ROW_0$ is activated (driven to approximately Vcc), the voltage level at the plate 22 of the capacitor 18 is transferred to the complementary digit line 43 which results in the digit line being lowered to a voltage level which is now less than Vcc/2. When the isolation line ISO is activated, the complementary digit lines 41 and 43 of the array are coupled to the complementary digit lines 62 and 64, respectively, of the sense circuit 66. In this instance, the complementary digit line 62 is at approximately Vcc/2 while the complementary digit line 64 is lowered to the voltage level less than Vcc/2.

As a result of the complementary digit line 64 being at a lower voltage level than the complementary digit line 62, the transistors 68 and 74 are driven OFF while the transistors 70 and 72 are driven ON. When the transistors 68 and 74 are driven all the way OFF, the complementary digit line 62 is at approximately Vcc and the complementary digit line 64 is at approximately zero volts. Thus, the voltage level of the complementary digit line 62 corresponds to the binary 1 and the voltage level of the complementary digit line 64 corresponds to the binary 0 voltage stored in the addressed memory cell 14. The data stored in the sense circuit 66 is provided on a pair of output terminals 76 to read/write circuitry (not shown in FIG. 2).

The sense amplifier 40 further includes a switch circuit 78 which is coupled between the complementary digit lines 62 and 64 of the sense amplifier 40 and the complementary digit lines 41 and 43 of the memory array 12. Specifically, the switch circuit 78 includes a transistor 80 whose source and drain terminals are coupled between the complementary digit line 62 and the complementary digit line 43 and a transistor 82 whose source and drain terminals are coupled between the complementary digit line 64 and the complementary digit line 41. Each of the transistors 80 and 82 has its gate terminal coupled to an inversion line INV.

In operation, the switch circuit 78 functions to provide a voltage level on the complementary digit lines 41 and 43 which corresponds to the complement of the data stored in a memory cell 14 which was previously read into the sense circuit 66. For example, assume that data in the memory cell 14 coupled to the row line $ROW_0$ is a binary 1 so that the complementary digit lines 62 and 64 are driven to the voltage levels Vcc and 0, respectively, as previously described. After the complementary digit lines 62 and 64 are driven to Vcc and zero volts, respectively, the isolation line ISO is deactivated so that the complementary digit lines 62, 64 of the sense amplifier 40 are decoupled from the complementary digit lines 41 and 43. The sense circuit 66, however, retains the complementary digit lines 62 and 64 at these voltage levels until the sense circuit is equilibrated. In other words, the sense circuit 66 stores the data from the addressed memory cell 14 until equilibration. With the isolation transistors 58 and 60 turned OFF, the complementary digit lines 41 and 43 may be equilibrated by the equilibration circuit 46 so that each line is at approximately Vcc/2, although equilibration is not required.

After the complementary digit lines 41 and 43 have been equilibrated, the inversion line INV is activated to turn ON the transistors 80 and 82. When the transistor 80 is turned ON, the voltage level of approximately Vcc on the complementary digit line 62 is transferred to the complementary digit line 43. Likewise, when the transistor 82 is turned ON, the voltage level of approximately zero volts on the complementary digit line 64 is transferred to the complementary digit line 41. Note that initially a binary 1 was read from the memory cell 14 coupled to the row line $ROW_0$ while the switch circuit 78 now provides a voltage level of approximately Vcc on the complementary digit line 43 which corresponds to a binary 0, which is the complement of the 1 initially read from the memory cell. Thus, the sense amplifier 40 may be used to read a data value from a memory cell 14 and then provide the complement of that data value to the memory cell. It should be noted, that the complement of the data initially read from a memory cell 14 need not be provided to the same memory cell from which it was initially read. For example, if data was initially read from the memory cell 14 coupled to the row line $ROW_0$, the complement of the data stored in this memory cell could subsequently be stored in the memory cell 14 coupled to the row line $ROW_{N-1}$.

Figure 3:
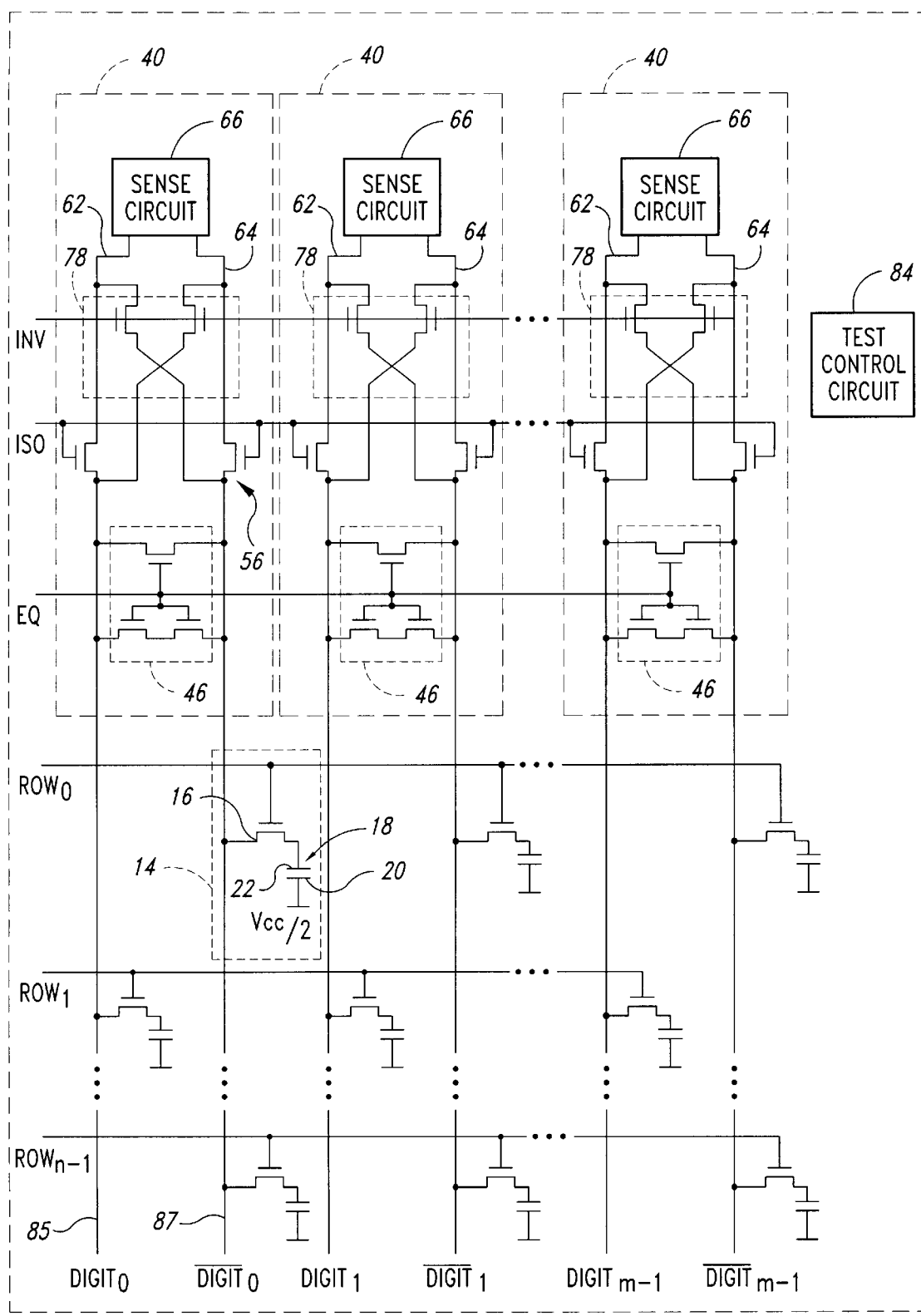
FIG. 3 is a schematic of a memory-cell array including sense amplifiers as shown in FIG. 2.

The use of the sense amplifier 40 to test memory cells 14 in a memory-cell array 12 will now be described with reference to FIG. 3. FIG. 3 illustrates a memory-cell array 12 which includes the sense amplifiers 40. As shown, each sense amplifier 40 is coupled to an associated pair of complementary digit lines 85 and 87 through the associated isolation circuit 56. A test control circuit 84 operates to provide signals on the inversion line INV, the isolation line ISO, the equilibration line EQ, the row lines ROW, and controls activation of the sense circuits 66 when the memory-cell array 12 is being tested.

To test the memory-cell array 12, the test control circuit 84 first writes a predetermined test pattern of data to each memory cell 14 in the memory-cell array. This test pattern of data is written to the memory cells 14 during standard write cycles as previously described with reference to the memory-cell array 12 of FIG. 1. The test pattern of data written to the memory cells 14 may be varied. For example, a binary 1 could be written to and stored in each memory cell 14, or alternatively a binary 0 could be written to and stored in each of the memory cells. In addition, an alternating bit pattern could be written to each memory cell 14 in a first row and the complement of this alternating bit pattern written to each memory cell in the next adjacent row. Thus, an alternating bit pattern 101010. . . could be written to the memory cells 14 coupled to the row line $ROW_0$ beginning with a binary 1 in the memory cell coupled to the complementary digit line 87. Thereafter, the alternating bit pattern 010101. . . would be written to the memory cells 14 coupled to the row line $ROW_1$ starting with a binary 0 in the memory cell coupled to the complementary digit line 85. The use of such complemented alternating bit patterns in adjacent rows is advantageous in that, by using such a test data bit pattern, shorts in adjacent memory cells 14 may be more easily detected.

After the test control circuit 84 has written and stored the predetermined test pattern of data in the memory cells 14, the test control circuit controls the sense amplifiers 40 as explained above so that data is read from each memory cell 14 in an activated row and the complement of this read data is then stored in each memory cell of that row. For example, assume that a binary 1 has been stored in each memory cell 14 coupled to the row line $ROW_0$. The test control circuit 84 then equilibrates the sense amplifiers 40 and complementary digit lines 85 and 87. Next, the test control circuit 84 activates the isolation line ISO so that each pair of complementary digit lines 85 and 87 is coupled to the complementary digit lines 62 and 64 of the associated sense circuit 66. The test control circuit 84 then activates the row line $ROW_0$ so that a voltage corresponding to the binary 1 stored in each memory cell 14 in that row is provided on the respective complementary digit lines 87. The sense circuits 66 sense this data by driving the digit lines 62 and 64 to voltage levels corresponding to a binary 1 and 0, respectively. The test control circuit 84 then deactivates the isolation line ISO and each of the sense circuits 66 maintains the complementary digit lines 62 and 64 at the voltage levels corresponding to binary 1 and 0, respectively. The row line $ROW_0$ is then deactivated by the test control circuit 84 and an equilibrate cycle is performed to equilibrate the complementary digit lines 85 and 87.

After the equilibrate cycle, the test control circuit 84 activates the inversion line INV to provide a voltage level corresponding to a binary 0 on each of the complementary digit lines 87. The row line $ROW_0$ is then activated so that the voltage corresponding to binary 0 on the complementary digit line 87 is transferred or written to each memory cell 14 in this row. The test control circuit 84 then deactivates the row line $ROW_0$ so that binary 0 data is now stored in each of the memory cells 14 coupled to the row line $ROW_0$. In a preferred embodiment, the test control circuit 84 performs this read-complement-write sequence to each row of memory cells 14 two times so that the data stored in each memory cell 14 has the same binary value that it did initially.

Figure 4:
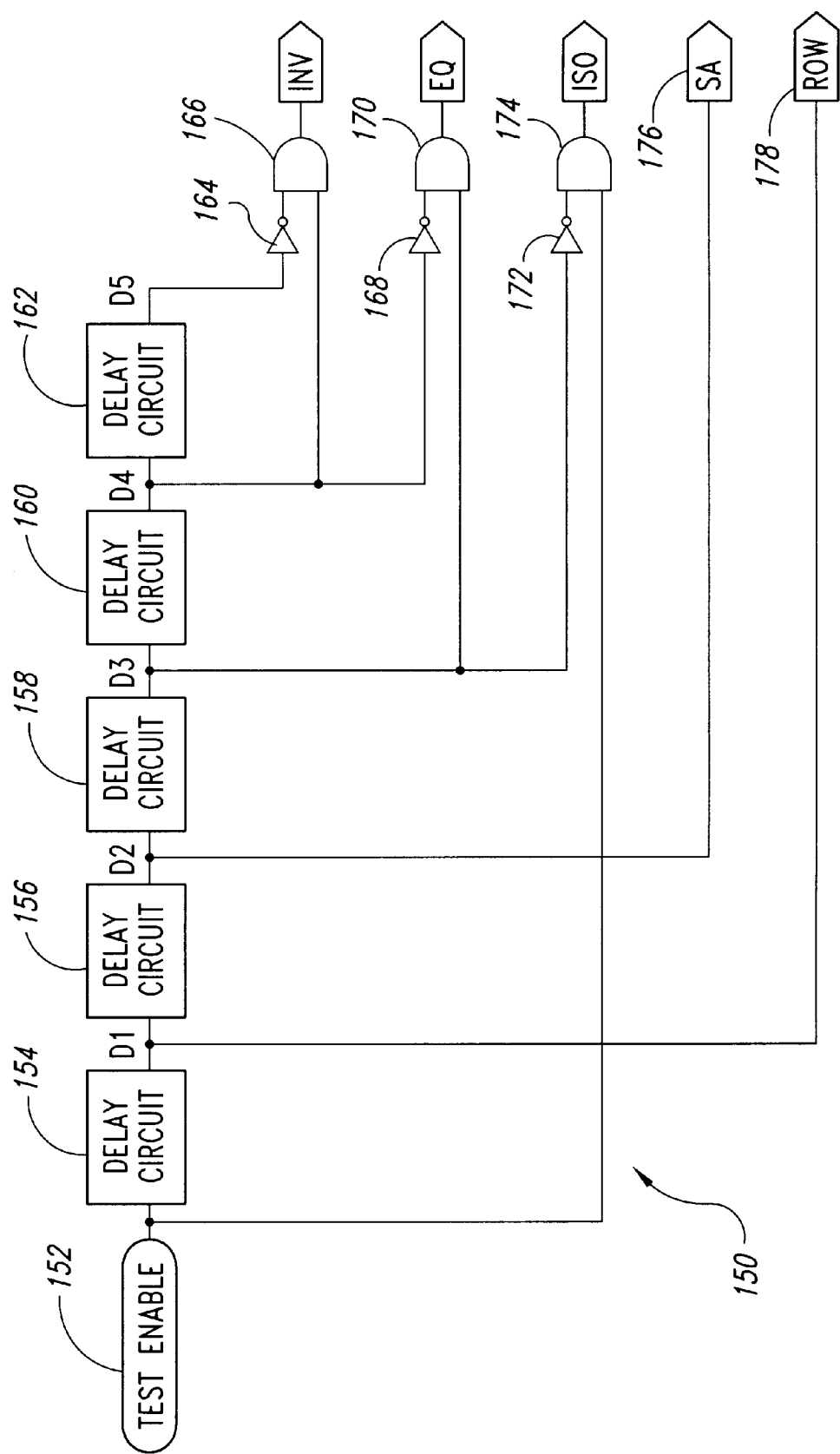
FIG. 4 is a functional block diagram of one embodiment of signal generation circuitry of the test control circuit of FIG. 3.

FIG. 4 illustrates one embodiment of a signal generation circuit 150 which is part of the test control circuit 84 and which functions to provide the signals used by the test control circuit to control testing of the memory cell array 12. The signal generation circuit 150 includes a plurality of delay circuits 154–162 connected in series. Each delay circuit 154–162 operates to provide a true logic level signal on an output terminal a predetermined time after receiving a true logic level signal on an input terminal. In the embodiment of FIG. 4, a true signal has a high voltage of approximately Vcc. The predetermined time after which a delay circuit provides a true logic level signal on its output terminal in response to receiving a true logic level signal on its input is the delay time of the delay circuit. Each of the delay circuits 154–162 has a predetermined delay time, the value of which is dictated by the timing requirements of the memory-cell array 12 being tested. The output signals provided by the delay circuits 154–162 are designated D1–D5, respectively. In addition, each delay circuit 154–162 includes a reset input (not shown) which allows other circuitry in the test control circuit 84 to reset the delay circuits to thereby cause the output signals D1–D5 to go low.

The output terminal of the delay circuit 162 is coupled through an inverter 164 to an input of an AND gate 166. A second input of the AND gate 166 is connected to the output terminal of the delay circuit 160 and an output of the AND gate 166 is connected to the inversion line INV. The AND gate 166 operates to provide a high logic level on the inversion line INV when the output signal D5 has a low logic level and the output signal D4 has a high logic level. The output terminal of the delay circuit 160 is further connected through an inverter 168 to an input of an AND gate 170. A second input of the AND gate 170 is connected to the output terminal of the delay circuit 158 and an output of the AND gate is connected to the equilibration line EQ. The AND gate 170 operates to provide a high logic level on the equilibration line EQ when the output signal D4 has a low logic level and the output signal D3 has a high logic level.

The output terminal signal D3 from the delay circuit 158 is further connected through an inverter 172 to an input of an AND gate 174. A second input of the AND gate 174 is connected to a test enable terminal 152 and an output of the AND gate connected to the isolation line ISO. The AND gate 174 operates to provide a high logic level on the isolation line ISO when the output signal D3 has a low logic level and a test enable signal on the terminal 152 has a high logic level. The output terminal of the delay circuit 156 is connected directly to a sense amp terminal 176 which functions to provide power to the sense circuits 66 when the output signal D2 has a high logic level. The output terminal from the delay circuit 154 is connected directly to a row terminal 178 which represents the row line ROW which is to be activated by the test control circuit 84.

Operation of the signal generation circuit 150 will now be described with reference to the signal timing diagram of FIG. 5. The signal timing diagram shows the various signals provided by the signal generator circuit 150 during one read-complement-write sequence executed by the test control circuit 84. The read-complement-write sequence begins at time $t_0$. Before time $t_0$, all signals are low resulting from reset of the delay circuits 154–162 in anticipation of the execution of a read-complement-write sequence. At time $t_0$, the test enable signal on the test enable terminal 152 goes high which causes the isolation line ISO to go high, thereby turning on the isolation transistors 58 and 60. The high test enable signal also causes the delay circuit 154 to drive its output signal D1 high after the delay time of the delay circuit, which occurs at time $t_1$.

In response to the output signal D1 going high, the row line ROW coupled to the terminal 178 goes high to thereby activate the specific row of memory cells 14 being accessed by the test control circuit 84. The high output signal D1 also causes the delay circuit 156 to drive its output signal D2 high after the delay time of the delay circuit, which occurs at time $t_2$. In response to the output signal D2 going high, the sense amp line SA goes high and thereby provides power to the sense circuits 66. The sense circuits 66 then store the data of the accessed memory cells 14 as previously described. The high output signal D2 also causes the delay circuit 158 to drive its output signal D3 high after the delay time of the delay circuit, which occurs at time $t_3$. The high output signal D3 causes the isolation line ISO to go low and thereby turn off the isolation transistors 58 and 60. In addition, the high output signal D3 causes the equilibration line EQ to go high and thereby turn on the equilibrate circuit 46 to equilibrate the complementary digit lines 85 and 87 of the memory-cell array 12. The high output signal D3 also causes the delay circuit 160 to drive its output signal D4 high after the delay time of the delay circuit, which occurs at time $t_4$.

The equilibration cycle lasts from time $t_3$ to time $t_4$. At time $t_4$, the high output signal D4 causes the equilibration line EQ to go low and thereby terminate the equilibration cycle. The high output signal D4 also causes the inversion line INV to go high and thereby couple the complementary digit lines 62 and 64 of the sense circuit 66 to the complementary digit lines 87 and 85, respectively, of the memory cell array 12. This causes the complement of the binary data read from the memory cells 14 coupled to the activated row line ROW to be stored in the memory cells of the activated row. The high output signal D4 also causes the delay circuit 162 to drive its output signal D5 high after the delay time of the delay circuit, which occurs at time $t_5$. At time $t_5$, the output signal D5 of the delay circuit 162 goes high causing the inversion line INV to go low and thereby isolate the sense circuits 66 from the digit lines 85 and 87 of the array 12. After time $t_5$, the delay circuits 154–162 are reset causing the output signals D1–D5 to go low.

In the embodiment of the signal generation circuit 150 shown in FIG. 4, it should be noted that the row line ROW is not deactivated during the equilibration cycle as was previously described. This results in the read-complement-write sequence being performed slightly faster than if the row line was deactivated, and also simplifies the signal generation circuit 150. One skilled in the art will realize that either method of performing the read-complement-write sequence is acceptable. The embodiment of the signal generation circuit 150 illustrated in FIG. 4 is merely one example of a circuit to provide the signals required by the test control circuit 84 to test the memory cell array 12. Other circuits, such as a state machine or a shift register, could also be used to generate the required signals.

Figure 6:
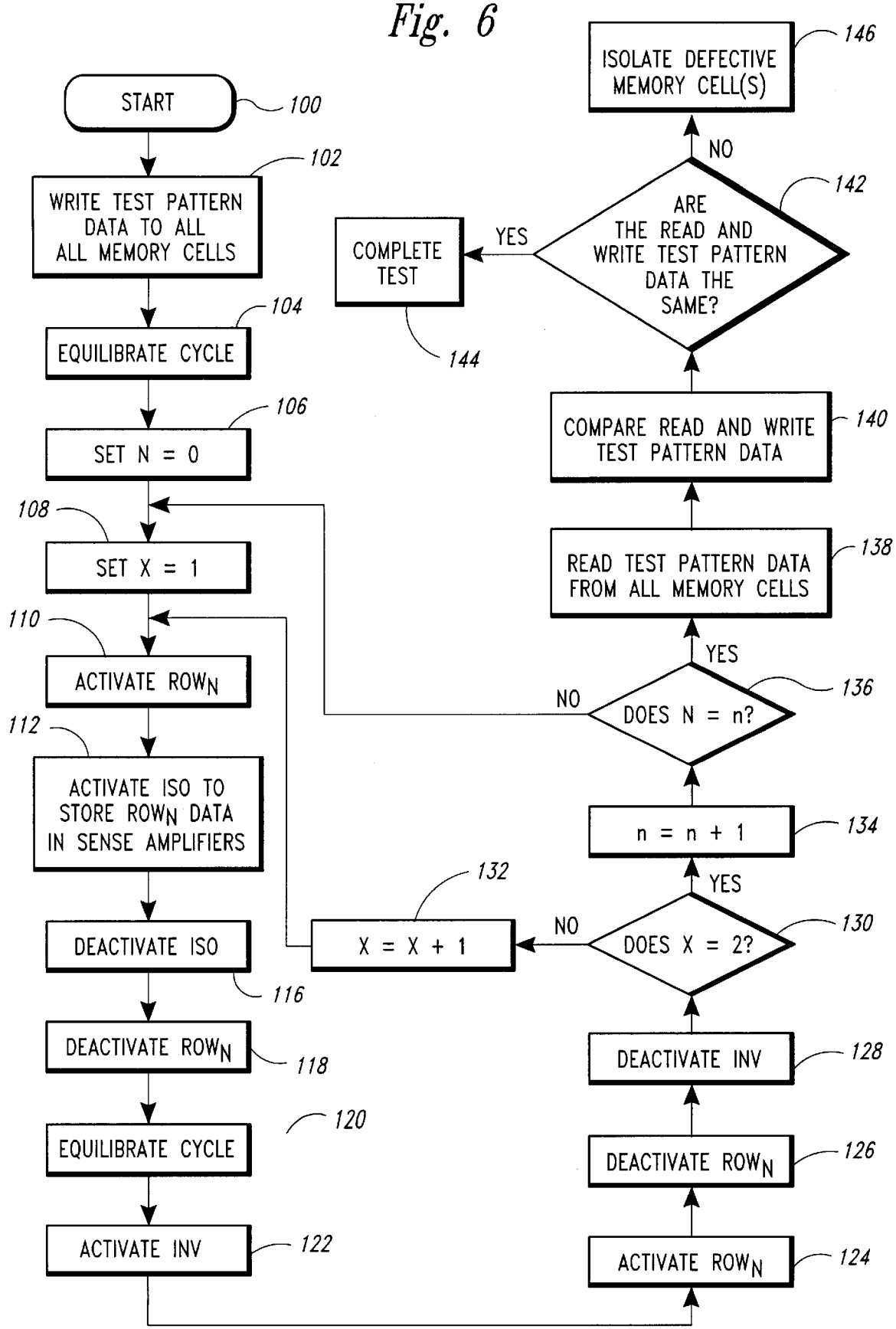
FIG. 6 is a flowchart of the process executed to test each of the memory cells in the memory-cell array of FIG. 3.

FIG. 6 is a flowchart showing one embodiment of a test process executed by the test control circuit 84 for testing each memory cell 14 in the memory-cell array 12. The process starts in step 100 and proceeds immediately to step 102. In step 102, the test control circuit 84 writes test pattern data to all of the memory cells 14 in the memory-cell array 12 using standard write cycles to store the test pattern data in each memory cell. From step 102, the process proceeds to step 104 in which the test control circuit 84 performs an equilibrate cycle to equilibrate all the sense amplifiers 40 and the complementary digit lines 85 and 87 to ready the memory-cell array for the next read cycle. The process then proceeds to step 106 in which the test control circuit 84 sets an index N equal to 0, where the index N corresponds to the row of memory cells 14 that is currently being accessed under control of the test control circuit. From step 106, the process proceeds to step 108 and the test control circuit 84 sets another index X equal to 1. The index X corresponds to the number of times data has been read from a row of memory cells 14 into the sense circuits 66 and the complement of that data written from the sense circuits to that row of memory cells.

From step 108, the process proceeds to step 110 in which the test control circuit 84 activates the row line $ROW_N$ where N is equal to the row of memory cells 14 accessed by the test control circuit. The first cycle through the process executed by the test control circuit 84, the row line $ROW_0$ is activated to provide the data stored in the memory cells 14 coupled to the row line $ROW_0$ on the respective complementary column lines. The process then goes to step 112 in which the test control circuit 84 activates the isolation line ISO so that the data provided by each of the memory cells 14 coupled to the row line $ROW_0$ is stored in the sense circuits 66. From step 112, the process goes to step 116 and the test control circuit 84 deactivates the isolation line ISO to decouple the sense circuits 66 from their respective complementary digit lines 85 and 87. After the isolation line ISO is deactivated, the data from the memory cells 14 coupled to the row line $ROW_0$ remains stored in the respective sense circuits 66. From step 116, the process goes to step 118 and the test control circuit 84 deactivates the row line $ROW_0$. After step 118, the process proceeds to step 120 where the test control circuit 84 performs an equilibrate cycle to equilibrate the complementary digit lines 85 and 87.

After the equilibration cycle performed by the test control circuit 84 in step 120, the process proceeds to step 122 and the test control circuit 84 activates the inversion line INV to provide the complement of the data initially stored in the memory cells 14 on the digit lines 87. The process goes from step 122 to step 124 in which the test control circuit 84 activates the row line $ROW_0$ to transfer complemented data to the memory cells 14 coupled to the row line $ROW_0$. After step 124, the process proceeds to step 126 in which the test control circuit 84 deactivates the row line $ROW_0$ so that the complemented data is now stored in the memory cells 14 coupled to the row line $ROW_0$. From step 126, the process proceeds to step 128 and the test control circuit 84 deactivates the inversion line INV.

The process goes from step 128 to step 130, in which the test control circuit 84 determines whether the index X is equal to 2. If the test control circuit 84 determines that the index X is not equal to 2, the process proceeds to step 132 and the value of the index X is set to X=X+1 such that the value of the index X is now equal to 2. From step 132, the process goes back to step 110 and the test control circuit 84 once again executes steps 110–128. After the test control circuit 84 has executed steps 110–128 two times, the data stored in the memory cells 14 coupled to the row line $ROW_0$ has the same binary value that it had initially.

After steps 110–128 have been executed two times by the test control circuit 84, the determination in step 130 is true and the process proceeds from step 130 to step 134. In step 134, the test control circuit 84 sets the index N equal to N+1 such that the value of the index N now equals 1. From step 134, the process proceeds to step 136 and the test control circuit 84 determines whether the value of the index N is equal to the value n where n is equal to the number of rows of memory cells 14 in the memory-cell array 12. The first time through the process, the value of the index N is equal to 1 in step 136 so the determination is negative and the process goes back to step 108. The steps 108–136 are once again executed by the test control circuit 84, except this time the operations performed in each of these steps are performed on the memory cells 14 coupled to the row line $ROW_1$. The test control circuit 84 repeatedly executes steps 108–136 until the determination in step 136 is positive, which means that data has twice been read from, complemented, and written to all the memory cells 14 in the memory-cell array 12.

Once the determination in step 136 is affirmative, the process proceeds to step 138. In step 138, the test control circuit 84 executes standard read cycles to read the data stored in each memory cell 14 of the memory-cell array 12. From step 138, the process proceeds to step 140. In step 140, the test control circuit 84 compares the data read from all the memory cells 14 in the memory-cell array 12 to the test pattern data initially written to all these memory cells. If all of the memory cells 14 are functioning properly, the test pattern data read from all the memory cells should be equal to the test pattern data initially written to all the memory cells. From step 140, the process proceeds to step 142 in which the test control circuit 84 determines whether the test pattern data read from the memory cells 14 does indeed equal the test pattern data initially written to those memory cells. If the determination in step 142 is positive, all of the memory cells 14 in the memory-cell array 12 are functioning properly and the process proceeds immediately to step 144 and the test mode executed by the test control circuit 84 is completed.

When the determination in step 142 is negative, however, this means that at least one of the memory cells 14 in the memory-cell array 12 is not functioning properly and in this case the process proceeds from step 142 to step 146 and the test control circuit 84 isolates the defective memory cell or cells in the memory-cell array. Various processes for isolating defective memory cells 14 in a memory-cell array 12 are known in the art, and any of these conventional processes may be executed by the test control circuit 84 in order to isolate the defective memory cell or cells.

Utilizing the sense amplifier 40 to perform testing of the memory-cell array 12 significantly reduces the time required to test the array. With the process of FIG. 4, the number of bus cycles required to test the memory-cell array 12 is roughly cut in half relative to prior art methods. This is true because the test data pattern need only be written to and read from the memory-cell array 12 once instead of twice as with prior art methods. Reducing the number of bus cycles by approximately 50% translates to a nearly 50% reduction in the test time of the memory-cell array 12 using the present invention.

Other test processes may also be executed by the control circuit 84 to test the memory-cell array 12. For example, in a first alternative embodiment of a test process executed by the control circuit 84, a test data pattern is written to the memory cells 14 in row 0 (i.e., coupled to row line $ROW_0$). The data stored in row 0 is then read into the sense amplifiers 40 and the complement of this data stored in row 1. Next, the data in row 1 is read into the sense amplifiers 40 and the complement stored in row 2. The control circuit 84 repeatedly executes these steps to propagate data from one row to the next adjacent row until data has been stored in row n−1.

Once data has been stored in row n−1, a standard read cycle is performed to read the data from row n−1. The data read from row n−1 is then complemented (assuming n is even) and compared to the data initially written to row 0. If the data is not the same, there is at least one defective memory cell 14 in the memory-cell array 12. In this process, only 2×m bus cycles are required to both write data to row 0 and read data from row n−1. Thus, this embodiment results in substantial time savings over prior art methods.

A second alternative embodiment of a test process executed by the control circuit 84 is similar to the previously described first alternative embodiment. In this embodiment, the process of the first alternative embodiment is executed until data is stored in row n−1. Once data is stored in row n−1, however, no standard read cycle is performed. Instead, the data stored in row n−1 is transferred to the sense amplifiers 40 and then stored in row 0. No complement of the data is performed for this one data transfer. When the number of rows n is even, this results in the complement of the data initially written to row 0 being stored in row 0. The process of the first alternative embodiment then repeats as before until data has once again been stored in row n−1. The data in row n−1 is then read and compared to the data initially written to row 0 to detect a defective memory cell.

Figure 7:
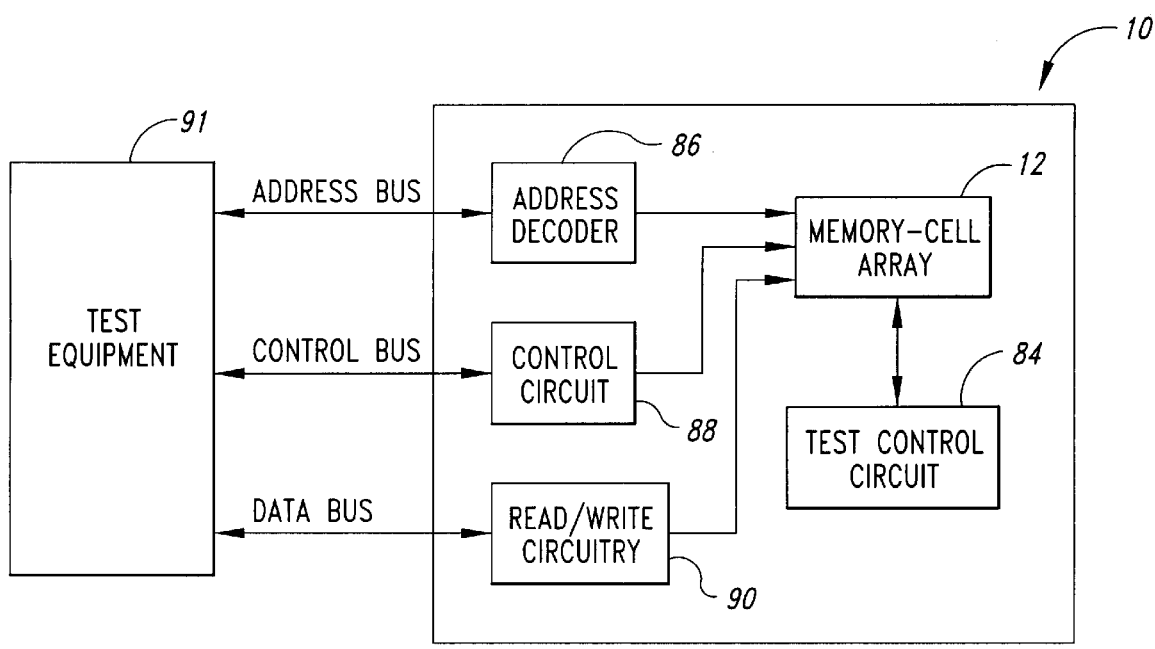
FIG. 7 is a block diagram of a memory device that includes the memory-cell array of FIG. 3.

FIG. 7 is a block diagram of a memory device 10 including a memory-cell array 12 of FIG. 3. The memory device 10 is a DRAM, where the term DRAM includes conventional DRAMs as well as synchronous DRAMs (SDRAM), synclink DRAMs (SLDRAM), rambus DRAMs (RDRAM), enhanced DRAMs (EDRAM), and any other type of DRAM cell based memory. The test control circuit 84 is shown as coupled to the memory-cell array 12 for controlling the test mode of the memory-cell array as previously described. The memory device 10 further includes an address decoder 86, control circuit 88, and read/write circuitry 90, all of which are conventional and known in the art. The address decoder 86, control circuit 88, and read/write circuitry 90 are all coupled to the memory-cell array 12. In addition, the address decoder 86 is coupled to an address bus, the control circuit 88 is coupled to a control bus, and the read/write circuitry 90 is coupled to a data bus. A piece of test equipment 91 may be coupled to the address, data, and control buses for testing the memory device 10.

In normal operation, external circuitry (not shown) provides address, control, and data signals on the respective busses to the memory device 10. During a read cycle, the external circuitry provides a memory address on the address bus and control signals on the control bus to the memory device 10. In response to the memory address on the address bus, the address decoder 86 provides a decoded memory address to the memory-cell array 12 while the control circuit 88 provides control signals to the memory-cell array 12 in response to the control signals on the control bus. The control signals from the control circuit 88 control the memory-cell array 12 so that the memory-cell array provides data to the read/write circuitry 90. The read/write circuitry 90 then provides this data on the data bus for use by the external circuitry. During a write cycle, the external circuitry provides a memory address on the address bus, control signals on the control bus, and data on the data bus. Once again, the address decoder 86 decodes the memory address on the address bus and provides a decoded address to the memory-cell array 12. The read/write circuitry 90 provides the data on the data bus to the memory-cell array 12 and this data is stored in the addressed memory cell in the memory-cell array under control of the control signals from the control circuit 88.

During testing of the memorytest equipment 91 controls signals on the address, data, and control buses to cause the test control circuit 84 to perform the previously described sequence of writing data to and reading data from the memory cell array 12. The test equipment 91 uses the results of this test sequence to detect a faulty memory cell 14 in the array 12. When a faulty memory cell 14 is detected, the test equipment 91 typically operates to program the memory device 10 to substitute redundant memory cells (not shown) on the memory device for the detected faulty memory cells 14 and thereby allow an otherwise defective memory device to be utilized.

Figure 5:
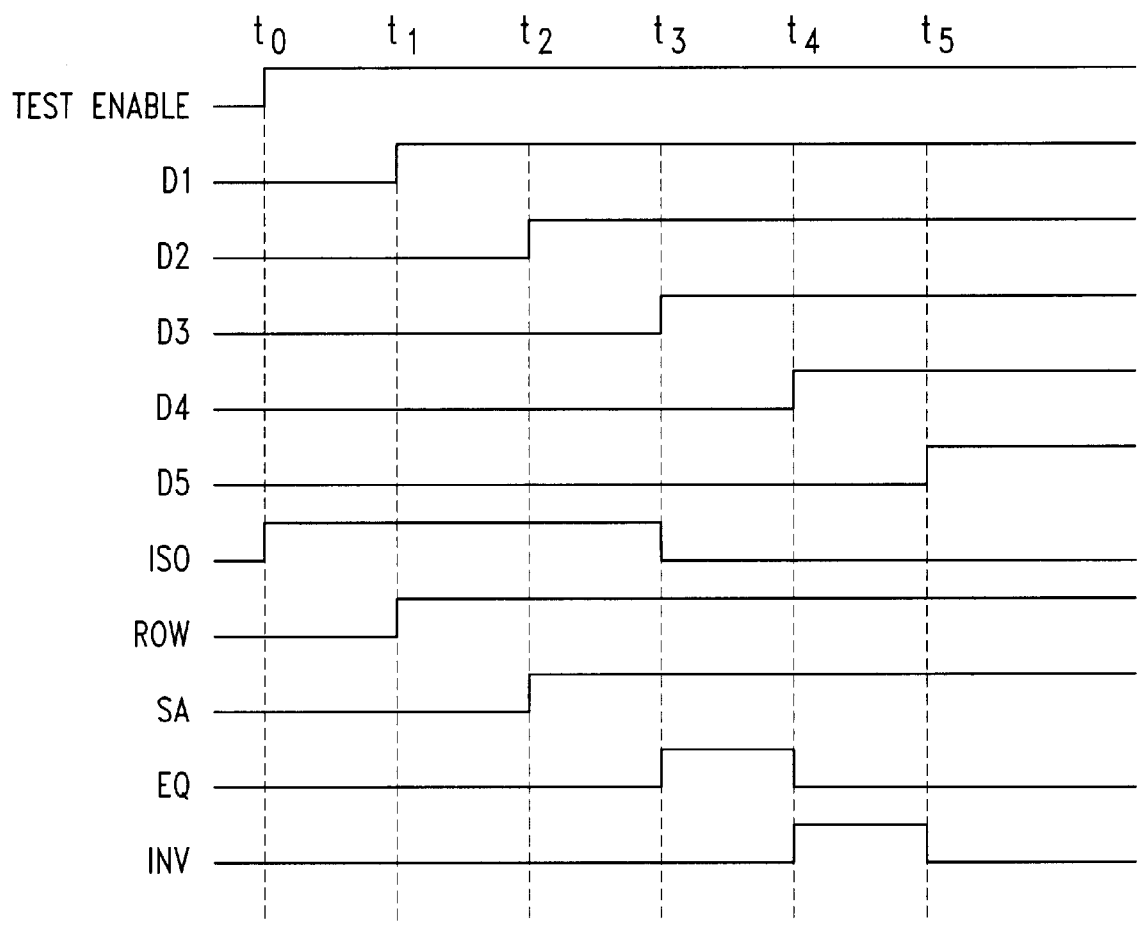
FIG. 5 is a signal timing diagram for the signals generated by the signal generation circuitry of FIG. 4.
Figure 8:
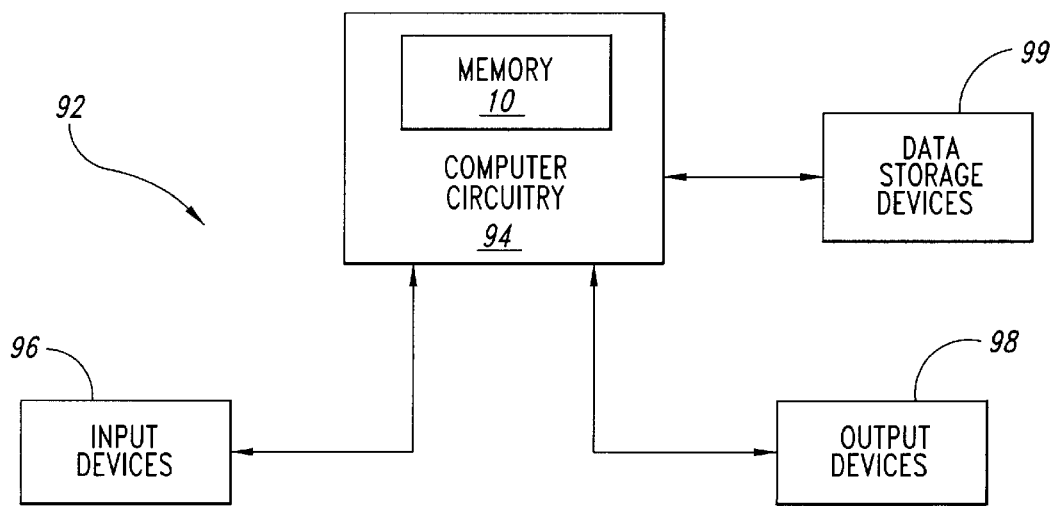
FIG. 8 is a block diagram of a computer system that includes the memory device of FIG. 3.

FIG. 8 is a block diagram of a computer system 92 which uses the memory device 10 of FIG. 5. The computer system 92 includes computer circuitry 94 for performing various computing functions, such as executing specific software to perform specific calculations or tasks. In addition, the computer system 92 includes one or more input devices 96, such as a keyboard or a mouse, coupled to the computer circuitry 94 to allow an operator to interface with the computer system. Typically, the computer system 92 also includes one or more output devices 98 coupled to the computer circuitry 94, such output devices typically being a printer or a video terminal. One or more data storage devices 99 are also typically coupled to the computer circuitry 94 to store data or retrieve data from external storage media (not shown). Examples of typical storage devices 99 include hard and floppy disks, tape cassettes, and compact disk read only memories (CD-ROMs). The computer circuitry 94 is typically coupled to the memory device 10 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

We claim:

1. A circuit in a memory device for providing the complement of data stored in a sense amplifier, the sense amplifier having a pair of first and second complementary data lines and the memory device including an array of memory cells arranged in rows and columns, the sense amplifier associated with a pair of first and second digit lines coupled to a column of memory cells, the circuit comprising:

a first switching circuit having a first terminal coupled to the first data line, a second terminal coupled to the first digit line, and a third terminal coupled the second digit line, the first switching circuit selectively coupling the first terminal to one of the second and third terminals or isolating the first terminal from the second and third terminals responsive to a control signal; and a second switching circuit having a first terminal coupled to the second data line, a second terminal coupled to the second digit line, and a third terminal coupled to the first digit line, the second switching circuit selectively coupling the first terminal to one of the second and third terminals or isolating the first terminal from the second and third terminals responsive to the control signal.

2. The circuit of claim 1 wherein each of the first and second switching circuits comprises:

a first coupling circuit having a control terminal and signal terminals coupled between the first and second terminals; and a second coupling circuit having a control terminal and signal terminals coupled between the first and third terminals.

3. The circuit of claim 2 wherein each of the first and second coupling circuits is a transistor.

4. A data complement circuit coupled between a pair of first and second complementary data lines of a sense amplifier and a pair of first and second complementary digit lines of a column of memory cells, the data complement circuit operable in a first mode to couple the first and second complementary data lines of the sense amplifier to the first and second complementary digit lines of the column of memory cells, respectively, and the data complement circuit operable in a second mode to isolate the first and second complementary data lines of the sense amplifier from the first and second complementary digit lines of the column of memory cells, respectively, and to couple the first complementary data line of the sense amplifier to the second complementary digit line of the column of memory cells and the second complementary data line of the sense amplifier to the first complementary digit line of the column of memory cells.

5. The data complement circuit of claim 4 further comprising:

a first coupling circuit having a control terminal, a first signal terminal coupled to the first complementary data and a second signal terminal coupled to the first complementary digit line;

a second coupling circuit having a control terminal coupled to the control terminal of the first coupling circuit, a first signal terminal coupled to the second complementary data line and a second signal terminal coupled to the second complementary digit line;

a third coupling circuit having a control terminal, a first signal terminal coupled to the first complementary data line and a second signal terminal coupled to the second complementary digit line; and a fourth coupling circuit having a control terminal coupled to the control terminal of the first coupling circuit, a first signal terminal coupled to the second complementary data line and a second signal terminal coupled to the first complementary digit line.

6. The circuit of claim 5 wherein each of the first, second, third, and fourth coupling circuits is a transistor.

7. A memory-cell array, comprising:

a plurality of row lines;

a plurality of pairs of first and second complementary digit lines;

an array of memory cells that each have a control terminal coupled to one of the row lines and a data terminal coupled to one of the first and second complementary digit lines of an associated pair of complementary digit lines;

a plurality of sense amplifiers, each sense amplifier associated with one of the pairs of first and second complementary digit lines and each sense amplifier including first and second complementary data lines;

a plurality of equilibration circuits, each equilibration circuit coupled between one of the pairs of complementary digit lines and operable to equalize the voltage levels on the digit lines to a predetermined level responsive to an equilibration signal; and a plurality of data complement circuits, each data complement circuit including, a first switching circuit having a first terminal coupled to the first data line of the associated sense amplifier, a second terminal coupled to the associated first digit line, and a third terminal coupled the associated second digit line, the first switching circuit selectively coupling the first terminal to one of the second and third terminals or isolating the first terminal from the second and third terminals responsive to a control signal, and a second switching circuit having a first terminal coupled to the second data line of the associated sense amplifier, a second terminal coupled to the associated second digit line, and a third terminal coupled to the associated first digit line, the first switching circuit selectively coupling the first terminal to one of the second and third terminals or isolating the first terminal from the second and third terminals responsive to the control signal.

8. The memory-cell array of claim 7 wherein each of the first and second switching circuits comprises:

a first coupling circuit having a control terminal and signal terminals coupled between the first and second terminals; and a second coupling circuit having a control terminal and signal terminals coupled between the first and third terminals.

9. The memory-cell array of claim 8 wherein each of the first and second coupling circuits is a transistor.

10. The memory-cell array of claim 7 wherein each memory cell comprises:
a storage element having a first storage terminal and a second storage terminal, the second storage terminal coupled to a reference voltage source of approximately Vcc/2; and
a memory switch circuit having a control terminal coupled to an associated row line, a first data terminal coupled to the first storage terminal of the storage element, and a second data terminal coupled to one of the associated first and second complementary digit lines of the associated column of memory cells.

11. A dynamic random access memory, comprising:
an address bus;
a control bus;
a data bus;
an address decoder coupled to the address bus;
a control circuit coupled the control bus;
a read/write circuit coupled to the data bus; and
a memory-cell array coupled to the address decoder, control circuit, and read/write circuit, the memory cell array including,
   a plurality of row lines,
   a plurality of pairs of first and second complementary digit lines,
   an array of memory cells that each have a control terminal coupled to one of the row lines and a data terminal coupled to one of the first and second complementary digit lines of an associated pair of complementary digit lines,
a plurality of sense amplifiers, each sense amplifier associated with one of the pairs of first and second complementary digit lines and each sense amplifier including first and second complementary data lines,
a plurality of equilibration circuits, each equilibration circuit coupled between one of the pairs of complementary digit lines and operable to equalize the voltage levels on the digit lines to a predetermined level responsive to an equilibration signal, and
a plurality of data complement circuits, each data complement circuit including,
a first switching circuit having a first terminal coupled to the first data line of the associated sense amplifier, a second terminal coupled to the associated first digit line, and a third terminal coupled the associated second digit line, the first switching circuit selectively coupling the first terminal to one of the second and third terminals or isolating the first terminal from the second and third terminals responsive to a control signal, and
a second switching circuit having a first terminal coupled to the second data line of the associated sense amplifier, a second terminal coupled to the associated second digit line, and a third terminal coupled to the associated first digit line, the first switching circuit selectively coupling the first terminal to one of the second and third terminals or isolating the first terminal from the second and third terminals responsive to the control signal.

12. The dynamic random access memory of claim 11 wherein each of the first and second switching circuits comprises:
a first coupling circuit having a control terminal and signal terminals coupled between the first and second terminals; and
a second coupling circuit having a control terminal and signal terminals coupled between the first and third terminals.

13. The dynamic random access memory of claim 12 wherein each of the first and second coupling circuits is a transistor.

14. The memory-cell array of claim 11 wherein each memory cell comprises:
a storage element having a first storage terminal and a second storage terminal, the second storage terminal coupled to a reference voltage source of approximately Vcc/2; and
a memory switch circuit having a control terminal coupled to an associated row line, a first data terminal coupled to the first storage terminal of the storage element, and a second data terminal coupled to one of the associated first and second complementary digit lines of the associated column of memory cells.

15. A computer system, comprising:
a data input device;
a data output device;
an address bus;
a data bus;
a control bus; and
computing circuitry coupled to the data input and output devices, and the data, address, and control busses, the computing circuitry including a dynamic random access memory that includes,
   an address bus,
   a control bus,
   a data bus,
   an address decoder coupled to the address bus,
   a control circuit coupled the control bus,
   a read/write circuit coupled to the data bus, and
   a memory-cell array coupled to the address decoder, control circuit, and read/write circuit, the memory cell array including,
      a plurality of row lines,
      a plurality of pairs of first and second complementary digit lines,
      an array of memory cells that each have a control terminal coupled to one of the row lines and a data terminal coupled to one of the first and second complementary digit lines of an associated pair of complementary digit lines,
      a plurality of sense amplifiers, each sense amplifier associated with one of the pairs of first and second complementary digit lines and each sense amplifier including first and second complementary data lines,
      a plurality of equilibration circuits, each equilibration circuit coupled between one of the pairs of complementary digit lines and operable to equalize the voltage levels on the digit lines to a predetermined level responsive to an equilibration signal, and
      a plurality of data complement circuits, each data complement circuit including,
         a first switching circuit having a first terminal coupled to the first data line of the associated sense amplifier, a second terminal coupled to the associated first digit line, and a third terminal coupled the associated second digit line, the first switching circuit selectively coupling the first terminal to one of the second and third terminals or isolating the first terminal from the second and third terminals responsive to a control signal, and a second switching circuit having a first terminal coupled to the second data line of the associated sense amplifier, a second terminal coupled to the associated second digit line, and a third terminal coupled to the associated first digit line, the first switching circuit selectively coupling the first terminal to one of the second and third terminals or isolating the first terminal from the second and third terminals responsive to the control signal.

16. The memory-cell array of claim 15 wherein each memory cell comprises:

a storage element having a first storage terminal and a second storage terminal, the second storage terminal coupled to a reference voltage source of approximately Vcc/2; and a memory switch circuit having a control terminal coupled to an associated row line, a first data terminal coupled to the first storage terminal of the storage element, and a second data terminal coupled to one of the associated first and second complementary digit lines of the associated column of memory cells.

17. A method of storing the complement of data stored in an array of memory cells arranged in rows and columns in a memory device, the method comprising the steps of:

activating an initial row of memory cells in the array;

storing in the memory device the data contained in each memory cell in the activated row;

complementing the stored data; and transferring the complemented data to the memory cells of another activated row in the array.

18. The method of claim 17 wherein the initial row and the another row are the same row of memory cells.

19. The method of claim 17 wherein the another row of memory cells is a row adjacent the initial row of memory cells.

20. A method for testing an array of memory cells in a memory device, the memory cells being arranged in rows and columns, the method comprising the steps of:

writing data to an initial row of memory cells;

activating the initial row of memory cells;

storing the data of the activated memory cells in the memory device;

activating another row of memory cells;

transferring the complement of the stored data to the another row of memory cells;

reading data from the another row of memory cells; and comparing data read from the another row of memory cells to data written to the initial row of memory cells to detect a defective memory cell.

21. The method of claim 20 wherein the initial row and the another row are the same row of memory cells.

22. The method of claim 20 wherein the another row of memory cells is a row adjacent the initial row of memory cells.

23. The method of claim 20 wherein the initial row and another row are the same row of memory cells.

24. The method of claim 23 wherein the steps of the method are performed twice.

25. The method of claim 20 wherein the step of writing data to an initial row of memory cells includes the step of writing an alternating bit pattern to the cells in the initial row.

26. A method for testing an array of memory cells in a memory device, the memory cells arranged in rows and columns, comprising the steps of:

writing data to every memory cell in the array;

activating a row of memory cells;

storing in the memory device the data of the memory cells in the activated row;

transferring the complement of the stored data to the memory cells in the activated row;

deactivating the activated row of memory cells;

equilibrating the array;

repeating the steps of activating a row through equilibrating the array on each row in the array;

reading data from all memory cells in the array; and comparing the data read to the data initially written in the step of writing data to every memory cell in the array to detect a defective memory cell.

27. The method of claim 26 wherein the step of writing data to every memory cell in the memory-cell array includes the step of writing a checkerboard pattern of data to the memory-cell array.

28. A method for testing an array of memory cells arranged in rows and columns, comprising the steps of:

writing data to a row of memory cells in the array;

equilibrating the array;

activating the row of memory cells;

storing in the memory device the data contained in the activated row;

deactivating the row;

activating another row of memory cells;

transferring the complement of the stored data to the memory cells in the another row;

repeating the steps of equilibrating through transferring on successive rows of memory cells until the step of transferring has transferred the complement of data to a final row in the array;

reading data from the memory cells in the final row; and comparing the data read from the final row to the data initially written in the step of writing to detect a defective memory cell.

29. The method of claim 28 wherein the step of writing data to a row of memory cells in the array includes the step of writing an alternating bit pattern to the row.

30. A method for testing an array of memory cells arranged in rows and columns, comprising the steps of:

writing data to a row of memory cells in the array;

storing in the memory device the data in the memory cells of the row;

transferring the complement of the stored data to another row of memory cells in the array;

repeating the steps of activating through transferring until data has been transferred to a final row in the array;

storing in the memory device the data in the final row;

transferring the stored data to the row initially written to when the number of rows from the row initially written to through the final row inclusive is even;

transferring the complement of the stored data to the row initially written to when the number of rows from the row initially written to through the final row inclusive is odd;

reading data from the memory cells in the final row; and comparing the data read from the final row to the data initially written in the step of writing to detect a defective memory cell.

31. The method of claim 30 wherein the step of writing transfers an alternating bit pattern to the row.

* * * * *